US012225762B2

(12) United States Patent
Bae et al.

(10) Patent No.: US 12,225,762 B2
(45) Date of Patent: Feb. 11, 2025

(54) DISPLAY DEVICE

(71) Applicant: Samsung Display Co., Ltd., Yongin-Si (KR)

(72) Inventors: Kwang Soo Bae, Yongin-si (KR); Beomsoo Park, Seongnam-si (KR); Minjeong Oh, Gimpo-si (KR); Youngje Cho, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 540 days.

(21) Appl. No.: 17/523,345

(22) Filed: Nov. 10, 2021

(65) Prior Publication Data

US 2022/0149333 A1    May 12, 2022

(30) Foreign Application Priority Data

Nov. 11, 2020   (KR) .................. 10-2020-0150094

(51) Int. Cl.
*H10K 50/856* (2023.01)
*H10K 50/844* (2023.01)
*H10K 59/38* (2023.01)
*H10K 59/40* (2023.01)

(52) U.S. Cl.
CPC ......... *H10K 50/856* (2023.02); *H10K 50/844* (2023.02); *H10K 59/38* (2023.02); *H10K 59/40* (2023.02)

(58) Field of Classification Search
CPC .... H10K 50/856; H10K 50/844; H10K 59/40; H10K 59/38
See application file for complete search history.

(56) References Cited

U.S. PATENT DOCUMENTS

| 10,199,608 B2* | 2/2019 | Woo ..................... H10K 50/844 |
| 10,476,038 B2* | 11/2019 | Park ...................... H10K 59/30 |
| 10,553,662 B2* | 2/2020 | Lee ...................... H10K 59/126 |
| 2015/0028294 A1* | 1/2015 | Kim ...................... H10K 59/38 |
| | | 257/40 |
| 2015/0069362 A1* | 3/2015 | Ito ...................... H10K 50/856 |
| | | 257/40 |
| 2017/0271429 A1* | 9/2017 | Kim ...................... H10K 59/35 |

FOREIGN PATENT DOCUMENTS

| KR | 100897245 B1 | 5/2009 |
| KR | 101177569 B1 | 8/2012 |
| KR | 101288835 B1 | 8/2013 |
| KR | 1020150051602 A | 5/2015 |

* cited by examiner

*Primary Examiner* — Mary Ellen Bowman
(74) *Attorney, Agent, or Firm* — CANTOR COLBURN LLP

(57) ABSTRACT

A display device includes a substrate, a sub-pixel structure, a light blocking member, and a reflective member. A display area including a sub-pixel area is defined on the substrate. The sub-pixel structure is disposed in the sub-pixel area on the substrate. The light blocking member is disposed over the sub-pixel structure, and a first opening is defined in a portion of the light blocking member which overlaps the sub-pixel structure. The reflective member is disposed between the light blocking member and the sub-pixel structure, and the reflective member surrounds the sub-pixel structure and the first opening.

17 Claims, 6 Drawing Sheets

DISPLAY DEVICE

This application claims priority to Korean Patent Application No. 10-2020-0150094, filed on Nov. 11, 2020, and all the benefits accruing therefrom under 35 U.S.C. § 119, the content of which in its entirety is herein incorporated by reference.

BACKGROUND

1. Field

Embodiments relate generally to a display device. More particularly, embodiments of the invention relate to a display device including a reflective member.

2. Description of the Related Art

Flat panel display devices are widely used as display devices for replacing a cathode ray tube display device due to lightweight and thin characteristics thereof. Flat panel display devices may include a liquid crystal display device and an organic light emitting diode display device.

Recently, a display device, from which a polarizing layer capable of reducing reflection of a light incident from an outside (e.g., an external light) is removed, has been developed. In such a display device, the external light may be reflected from electrodes (e.g., an anode electrode, a cathode electrode, etc.) included in the display device. The display device may include a light blocking member and a color filter to reduce the reflection of the external light instead of the polarizing layer, and may reduce the reflection of the external light by increasing an area of the light blocking member.

SUMMARY

In a display device, from which a polarizing layer capable of reducing reflection of an external light is removed, when the area of the light blocking member is increased, the reflection of the external light may be relatively reduced, while an aperture ratio, a luminance, and the like of a light emitting layer included in the display device may be decreased, so that display quality of the display device may deteriorate.

Some embodiments provide a display device including a reflective member.

According to an embodiment, a display device includes a substrate, a sub-pixel structure, a light blocking member, and a reflective member. In such an embodiment, a display area including a sub-pixel area is defined on the substrate. In such an embodiment, the sub-pixel structure is disposed in the sub-pixel area on the substrate. In such an embodiment, the light blocking member is disposed over the sub-pixel structure, and a first opening is defined in a portion of the light blocking member which overlaps the sub-pixel structure. In such an embodiment, the reflective member is disposed between the light blocking member and the sub-pixel structure, and the reflective member surrounds the sub-pixel structure and the first opening.

In an embodiment, the reflective member may not overlap the first opening in a thickness direction of the substrate.

In an embodiment, the display device may further include a support member disposed between the light blocking member and the sub-pixel structure. In such an embodiment, a second opening may be defined in the support member to overlap the first opening.

In an embodiment, a side wall of the support member, which defines the second opening, may make contact with the reflective member.

In an embodiment, the side wall of the support member may be orthogonal to a top surface of the support member.

In an embodiment, the second opening may be larger than the first opening.

In an embodiment, the display device may further include an insulating layer which covers the reflective member and the support member over the sub-pixel structure.

In an embodiment, the light blocking member may make contact with a top surface of the insulating layer.

In an embodiment, the sub-pixel structure may include a lower electrode, a light emitting layer disposed on the lower electrode, where the light emitting layer may emit a light, and an upper electrode disposed on the light emitting layer. In such an embodiment, a part of the light emitted from the light emitting layer may be reflected from the reflective member.

In an embodiment, the display device may further include a pixel defining layer disposed on the sub-pixel structure, where an opening may be defined in the pixel defining layer to expose a part of a top surface of the lower electrode.

In an embodiment, a virtual line extending along a side wall of the pixel defining layer, which defines the opening of the pixel defining layer, may pass through the support member.

In an embodiment, each of the light blocking member and the pixel defining layer may have an opaque color.

In an embodiment, the display device may further include a thin film encapsulation structure disposed between the sub-pixel structure and the reflective member.

In an embodiment, the thin film encapsulation structure may include a first inorganic thin film encapsulation layer, an organic encapsulation layer disposed on the first inorganic thin film encapsulation layer, and a second inorganic thin film encapsulation layer disposed on the organic encapsulation layer.

In an embodiment, the display device may further include a touch sensing structure disposed between the thin film encapsulation structure and the reflective member.

In an embodiment, the touch sensing structure may make contact with a top surface of the thin film encapsulation structure.

In an embodiment, the display device may further include a color filter disposed on the light blocking member, where the color filter may fill the first opening.

According to embodiments of the invention, the display device may include a light blocking member having a relatively large area to reduce the reflection of the external light. In such embodiments, the display device includes the reflective member and the support member, such that a relatively large amount of the light emitted from the sub-pixel structure may be emitted to an outside of the display device. Accordingly, in such embodiments, even when the display device includes the light blocking member having a relatively large area, the luminance of the display device may be relatively increased, and the display quality of the display device that does not include a polarizing layer may be substantially improved.

In such embodiments, the display device includes the pixel defining layer having a relatively large tapering angle, such that an aperture ratio of the display device may be relatively increased.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
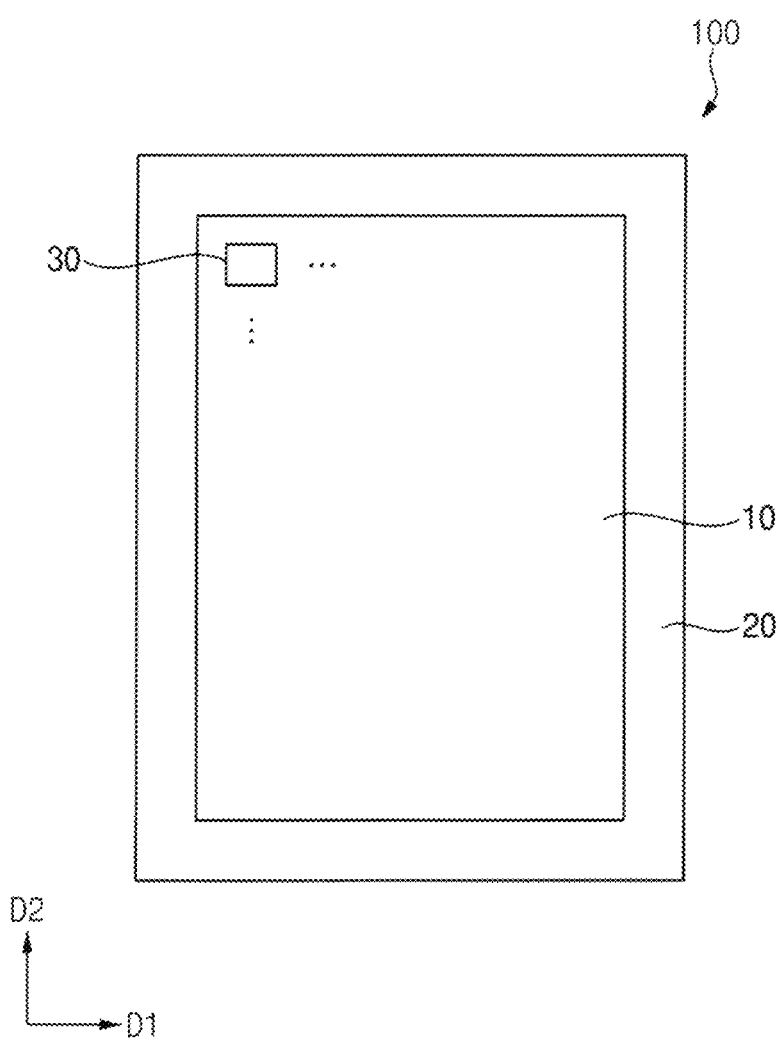
FIG. 1 is a plan view showing a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
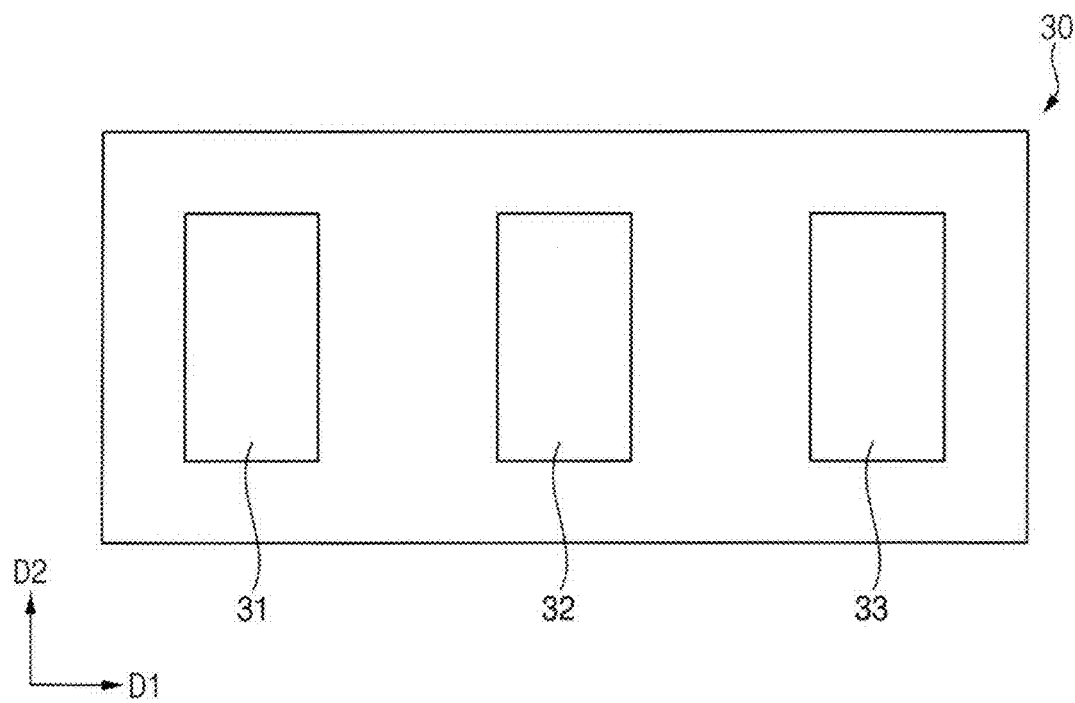
FIG. 2 is a plan view showing a pixel area included in the display device of FIG. 1.

FIG. 1 is a plan view showing a display device according to an embodiment of the invention, and FIG. 2 is a plan view showing a pixel area included in the display device of FIG. 1.

Referring to FIGS. 1 and 2, an embodiment of a display device 100 may include a display area 10 in which an image is displayed, and a peripheral area 20 in which the image is not displayed. In one embodiment, for example, the peripheral area 20 may substantially surround the display area 10.

The display area 10 may include a plurality of pixel areas 30. The pixel areas 30 may be arranged in a first direction D1 that is parallel to a top surface of the display device 100 and a second direction D2 that is parallel to the top surface of the display device 100 and substantially orthogonal to the first direction D1. A direction orthogonal to the first and second directions D1 and D2 or the top surface of the display device 100 may be a thickness direction of a substrate of the display device 100. In an embodiment, as shown in FIG. 2, one pixel area 30 among the pixel areas 30 may include a first sub-pixel area 31, a second sub-pixel area 32, and a third sub-pixel area 33. In such an embodiment, each of the pixel areas 30 may include first to third sub-pixel areas 31, 32, and 33.

First to third sub-pixels (e.g., a sub-pixel structure 200 of FIG. 5) may be disposed in the first to third sub-pixel areas 31, 32, and 33, respectively. In one embodiment, for example, the first sub-pixel may emit a red light, the second sub-pixel may emit a green light, and the third sub-pixel may emit a blue light. The display device 100 may display an image through the first to third sub-pixels.

In an embodiment, as described above, one pixel area 30 may include three sub-pixel areas 31, 32, and 33, but not being limited thereto. In one embodiment, for example, one pixel area 30 may have at least one sub-pixel area, e.g., four sub-pixel areas.

In an embodiment, as described above, the first to third sub-pixel areas 31, 32, and 33 may be arranged in the first direction D1, but not being limited thereto. Alternatively, the arrangement of the first to third sub-pixel areas 31, 32, and 33 may be variously changed or modified.

In an embodiment, as shown in FIGS. 1 and 2, each of the display area 10, the peripheral area 20, and the first to third sub-pixel areas 31, 32, and 33 may have a rectangular shape when viewed in a plan view, but not being limited thereto. In one alternative embodiment, for example, each of the display area 10, the peripheral area 20, and the first to third sub-pixel areas 31, 32, and 33 may have a triangular shape, a rhombic shape, a polygonal shape, a circular shape, a track shape, or an elliptical shape when viewed in a plan view.

Figure 3:
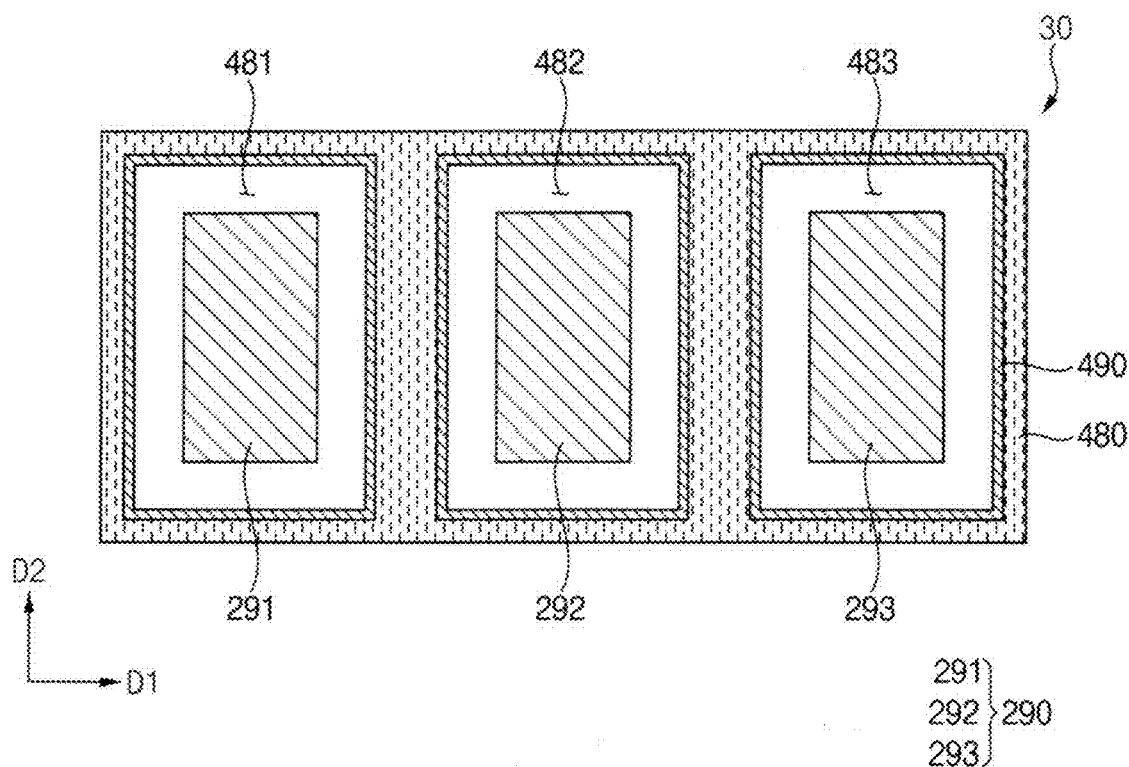
FIG. 3 is a plan view showing a support member and a reflective member in the pixel area of FIG. 2.
Figure 4:
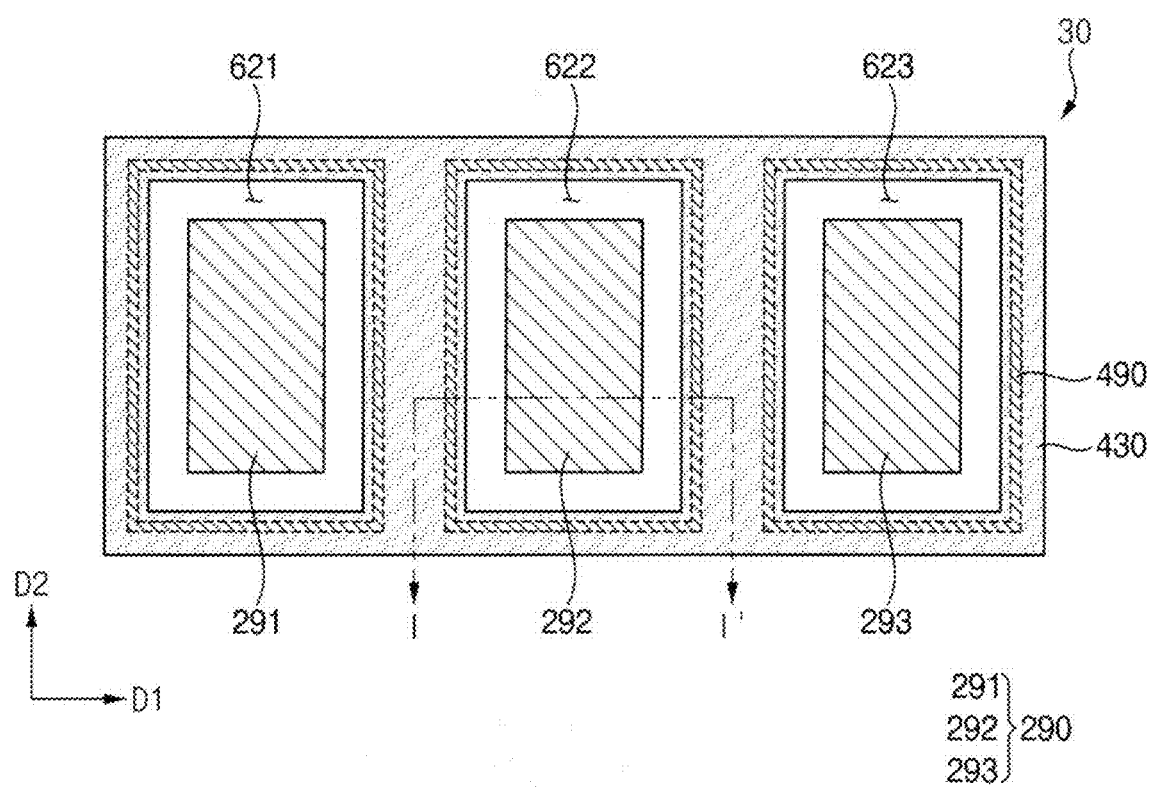
FIG. 4 is a plan view showing the reflective member and a light blocking member in the pixel area of FIG. 2.

FIG. 3 is a plan view showing a support member and a reflective member in the pixel area of FIG. 2, and FIG. 4 is a plan view showing the reflective member and a light blocking member in the pixel area of FIG. 2.

Referring to FIGS. 3 and 4, an embodiment of the display device 100 may include lower electrodes 290, reflective members 490, a light blocking member 430, and the like. In such an embodiment, the lower electrodes 290 may include first, second, and third lower electrodes 291, 292, and 293.

The first lower electrode 291 may be disposed in the first sub-pixel area 31, the second lower electrode 292 may be disposed in the second sub-pixel area 32, and the third lower electrode 293 may be disposed in the third sub-pixel area 33. In such an embodiment, the first to third lower electrodes 291, 292, and 293 may correspond to the first to third sub-pixel areas 31, 32, and 33, respectively.

In an embodiment, as shown in FIG. 3, a support member 480 may be disposed on the first to third lower electrodes 291, 292, and 293. The support member 480 may have a plate shape in which a plurality of openings is defined. In such an embodiment, first to third openings 481, 482, and 483 may be defined through the support member 480. In one embodiment, for example, the first opening 481 may expose the first lower electrode 291 (or the first sub-pixel area 31), the second opening 482 may expose the second lower electrode 292 (or the second sub-pixel area 32), and the third opening 483 may expose the third lower electrode 293 (or the third sub-pixel area 33). In such an embodiment, the support member 480 may not overlap the first to third lower electrodes 291, 292, and 293, respectively, when viewed in a plan view.

The reflective members 490 may be disposed above the first to third lower electrodes 291, 292, and 293, respectively. In such an embodiment, the reflective member 490 may be disposed on a side wall of the support member 480, which defines the first to third openings 481, 482, and 483 of the support member 480. In such an embodiment, the reflective member 490 may make direct contact with the side wall. The reflective members 490 may surround the first to third lower electrodes 291, 292, and 293, respectively, when viewed in a plan view. In such an embodiment, the reflective members 490 may surround the first to third sub-pixel areas 31, 32, and 33, respectively.

In an embodiment, as shown in FIG. 4, the light blocking member 430 may be disposed on the reflective members 490. The light blocking member 430 may have a plate shape in which a plurality of openings is defined. In such an embodiment, first to third openings 621, 622, and 623 may be defined through the light blocking member 430. In one embodiment, for example, the first opening 621 may expose the first lower electrode 291 (or the first sub-pixel area 31), an area of the first opening 621 of the light blocking member 430 may be smaller than an area of the first opening 481 of the support member 480, and the first opening 621 and the first opening 481 may overlap each other. In such an embodiment, the second opening 622 may expose the second lower electrode 292 (or the second sub-pixel area 32), an area of the second opening 622 of the light blocking member 430 may be smaller than an area of the second opening 482 of the support member 480, and the second opening 622 and the second opening 482 may overlap each other. In such an embodiment, the third opening 623 may expose the third lower electrode 293 (or the third sub-pixel area 33), an area of the third opening 623 of the light blocking member 430 may be smaller than an area of the third opening 483 of the support member 480, and the third opening 623 and the third opening 483 may overlap each other. In an embodiment, the reflective members 490 may surround the first to third openings 621, 622, and 623, respectively. In such an embodiment, the reflective members 490 may overlap the light blocking member 430 when viewed in a plan view or in the thickness direction of the display device 100.

Figure 5:
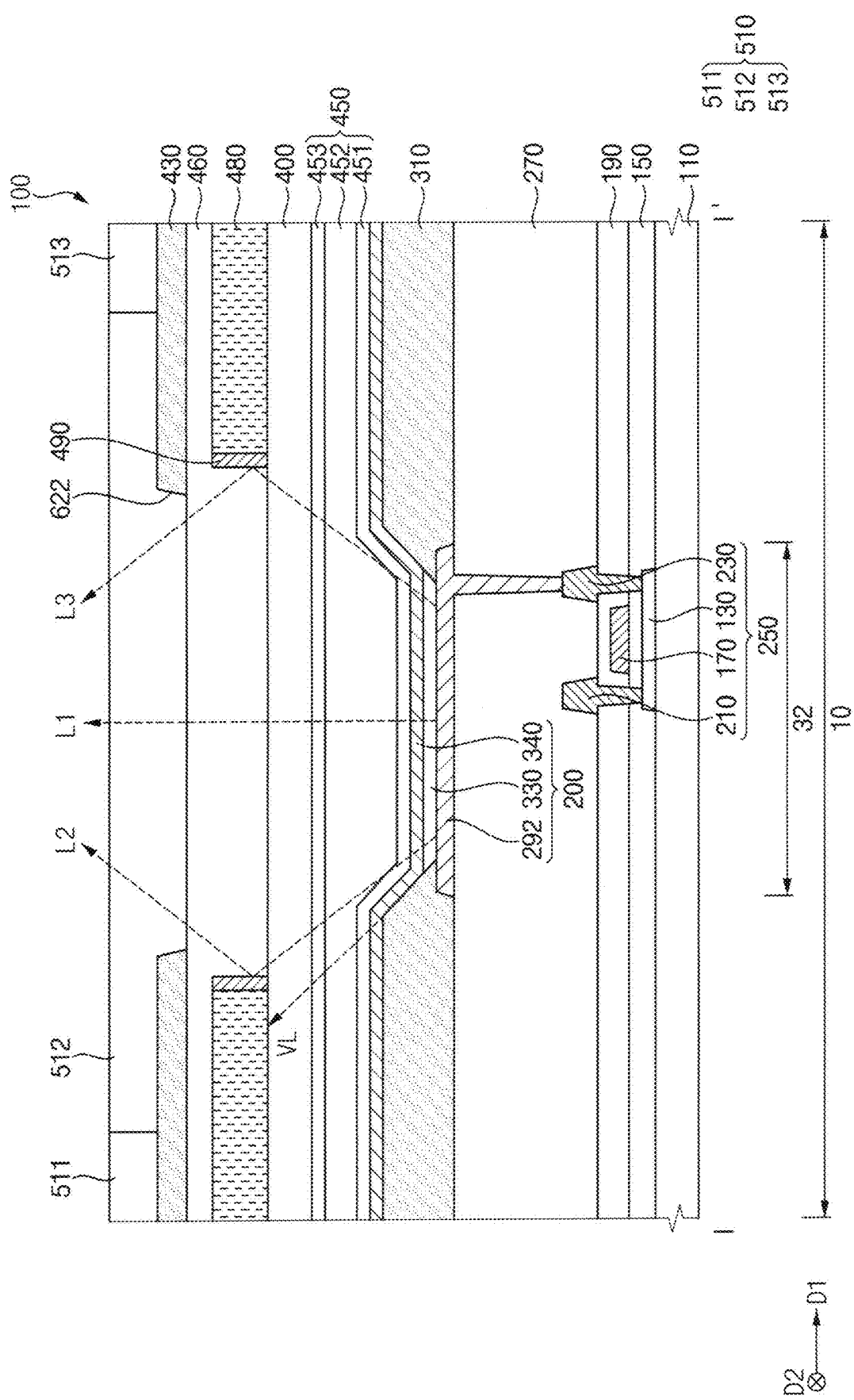
FIG. 5 is a cross-sectional view taken along line I-I' of the display device of FIG. 4.

FIG. 5 is a cross-sectional view taken along line I-I' of the display device of FIG. 4.

Referring to FIG. 5, an embodiment of the display device 100 may include a substrate 110, a semiconductor element 250, a gate insulating layer 150, an interlayer insulating layer 190, a planarization layer 270, a sub-pixel structure 200, a pixel defining layer 310, a thin film encapsulation structure 450, a touch sensing structure 400, a support member 480, a reflective member 490, an insulating layer 460, a light blocking member 430, color filters 510, and the like. In such an embodiment, the semiconductor element 250 may include an active layer 130, a gate electrode 170, a source electrode 210 and a drain electrode 230, and the sub-pixel structure 200 may include a lower electrode 290, a light emitting layer 330 and an upper electrode 340. In such an embodiment, the thin film encapsulation structure 450 may include a first inorganic thin film encapsulation layer 451, an organic encapsulation layer 452 and a second inorganic thin film encapsulation layer 453, and the color filters 510 may include a first color filter 511, a second color filter 512 and a third color filter 513.

In an embodiment, the substrate 110 may include a transparent or opaque material. The substrate 110 may be a transparent resin substrate having flexibility. In an embodiment, where the substrate 110 is the transparent resin substrate, the substrate 110 includes a polyimide substrate, for example. In such an embodiment, the polyimide substrate may have a stacked structure including a first polyimide layer, a barrier film layer, a second polyimide layer, and the like. In an alternative embodiment, the substrate 110 may include at least one selected from a quartz substrate, a synthetic quartz substrate, a calcium fluoride substrate, a fluorine-doped ("F-doped") quartz substrate, a soda lime glass substrate, a non-alkali glass substrate, and the like.

In an embodiment, a buffer layer (not shown) may be disposed on the substrate 110. The buffer layer may prevent metal atoms or impurities from diffusing from the substrate 110 to an upper structure (e.g., the semiconductor element 250, the sub-pixel structure 200, etc.), and may control a heat transfer rate during a crystallization process for forming the active layer 130 to obtain a substantially uniform active layer 130. In an embodiment, where a surface of the substrate 110 is not uniform, the buffer layer may serve to improve flatness of the surface of the substrate 110. Depending on a type of the substrate 110, at least two buffer layers may be provided on the substrate 110, or the buffer layer may be omitted. The buffer layer may include an organic insulating material or an inorganic insulating material.

The active layer 130 may be disposed in the pixel area 30 on the substrate 110. The active layer 130 may include a metal oxide semiconductor, an inorganic semiconductor (e.g., amorphous silicon or poly silicon), an organic semiconductor, or the like. The active layer 130 may have a source region and a drain region.

The gate insulating layer 150 may be disposed on the substrate 110 and the active layer 130. In one embodiment, for example, the gate insulating layer 150 may sufficiently cover the active layer 130 on the substrate 110, and may have a substantially flat top surface without creating a step structure around the active layer 130. Alternatively, the gate insulating layer 150 may be disposed along a profile of the active layer 130 with a uniform thickness to cover the active layer 130 on the substrate 110. The gate insulating layer 150 may include at least one selected from a silicon compound, a metal oxide, and the like. In one embodiment, for example, the gate insulating layer 150 may include at least one selected from silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and a combination thereof. In an embodiment, the gate insulating layer 150 may have a multilayer structure including a plurality of insulating layers. In one embodiment, for example, the insulating layers of the gate insulating layer 150 having a multilayer structure may have mutually different thicknesses, or may include mutually different materials.

The gate electrode 170 may be disposed on the gate insulating layer 150. In an embodiment, the gate electrode 170 may be disposed on a portion of the gate insulating layer 150 under which the active layer 130 is located or to overlap the active layer 130. The gate electrode 170 may include at least one selected from a metal, a metal alloy, metal nitride, conductive metal oxide, a transparent conductive material, and a combination thereof. In an embodiment, the gate electrode 170 may have a multilayer structure including a plurality of metal layers. In one embodiment, for example, the metal layers of the gate electrode 170 having a multilayer structure may have mutually different thicknesses, or may include mutually different materials.

The interlayer insulating layer 190 may be disposed on the gate insulating layer 150 and the gate electrode 170. In one embodiment, for example, the interlayer insulating layer 190 may sufficiently cover the gate electrode 170 on the gate insulating layer 150, and may have a substantially flat top surface without creating a step structure around the gate electrode 170. Alternatively, the interlayer insulating layer 190 may be disposed along a profile of the gate electrode 170 with a uniform thickness to cover the gate electrode 170 on the gate insulating layer 150. The interlayer insulating layer 190 may include at least one selected from a silicon compound, a metal oxide, and the like. In an embodiment, the interlayer insulating layer 190 may have a multilayer structure including a plurality of insulating layers. In one embodiment, for example, the insulating layers of the interlayer insulating layer 190 having a multilayer structure may have mutually different thicknesses, or may include mutually different materials.

The source electrode 210 and the drain electrode 230 may be disposed on the interlayer insulating layer 190. The source electrode 210 may be connected to the source region of the active layer 130 through a contact hole defined through, e.g., formed by removing, first portions of the gate insulating layer 150 and the interlayer insulating layer 190, and the drain electrode 230 may be connected to the drain region of the active layer 130 through a contact hole defined through, e.g., formed by removing, second portions of the gate insulating layer 150 and the interlayer insulating layer 190. Each of the source electrode 210 and the drain electrode 230 may include at least one selected from a metal, a metal alloy, metal nitride, conductive metal oxide, a transparent conductive material, and a combination thereof. In an embodiment, each of the source electrode 210 and the drain electrode 230 may have a multilayer structure including a plurality of metal layers. In one embodiment, for example, the metal layers of each of the source electrode 210 and the drain electrode 230 having a multilayer structure may have mutually different thicknesses, or may include mutually different materials.

In such an embodiment, as described above, the semiconductor element 250 including the active layer 130, the gate electrode 170, the source electrode 210, and the drain electrode 230 may be provided in the display device 100.

In FIG. 5, for convenience of illustration and description, one transistor (e.g., the semiconductor element 250) disposed in the second sub-pixel area 32 is shown, but the configuration of the invention is not limited thereto. In one alternative embodiment, for example, the second sub-pixel area 32 and the display area 10 adjacent to the second sub-pixel area 32 may have a configuration including at least two transistors and at least one capacitor.

In FIG. 5, for convenience of illustration and description, the semiconductor element 250 having a top gate structure is shown, but the configuration of the invention is not limited thereto. In one alternative embodiment, for example, the semiconductor element 250 may have a bottom gate structure and/or a double gate structure.

In an embodiment, the planarization layer 270 may be disposed on the interlayer insulating layer 190, the source electrode 210 and the drain electrode 230. In one embodiment, for example, the planarization layer 270 may have a relatively thick thickness to sufficiently cover the source and drain electrodes 210 and 230 on the interlayer insulating layer 190. In such an embodiment, the planarization layer 270 may have a substantially flat top surface. In an embodiment, a planarization process may be additionally performed on the planarization layer 270 to provide or form such a flat top surface of the planarization layer 270. In an embodiment, a contact hole may be defined through the planarization layer 270 to expose a top surface of the drain electrode 230. The planarization layer 270 may include an organic insulating material or an inorganic insulating material. In an embodiment, the planarization layer 270 may include an organic insulating material.

The second lower electrode 292 may be disposed in the second sub-pixel area 32 on the planarization layer 270. The second lower electrode 292 may make direct contact with the drain electrode 230 through the contact hole of the planarization layer 270, and the second lower electrode 292 may be electrically connected to the semiconductor element 250. The second lower electrode 292 may include at least one selected from a metal, a metal alloy, metal nitride, conductive metal oxide, a transparent conductive material, and a combination thereof. In an embodiment, the second lower electrode 292 may have a multilayer structure including a plurality of metal layers. In one embodiment, for example, the metal layers of the second lower electrode 292 having a multilayer structure may have mutually different thicknesses, or may include mutually different materials.

The pixel defining layer 310 may be disposed on the planarization layer 270. In an embodiment, the pixel defining layer 310 may be disposed on a part of the second lower electrode 292 and the planarization layer 270. The pixel defining layer 310 may cover both side portions of the second lower electrode 292, and an opening may be defined through the pixel defining layer 310 to expose a part of a top surface of the second lower electrode 292.

In such an embodiment, a line extending along a side wall of the pixel defining layer 310 that defines the opening will be defined as a virtual or imaginary line VL. In an embodiment, as shown in FIG. 5, the virtual line VL may pass through the support member 480. In such an embodiment, a tapering angle of the pixel defining layer 310 may be relatively large. In such an embodiment, the tapering angle may be an angle formed between the side wall and a top surface of the pixel defining layer 310.

In a conventional display device, an area of a light blocking member may be increased to reduce reflection of an external light instead of a polarizing layer. Accordingly, in such a conventional display device, a tapering angle of a pixel defining layer may be relatively small to reduce absorption of a light emitted from a light emitting layer to a bottom surface of the light blocking member.

In an embodiment of the invention, the reflective member 490 is disposed under the light blocking member 430, such that lights directed to a bottom surface of the light blocking member 430 (e.g., a second light L2 and a third light L3) may be reflected even when the tapering angle of the pixel defining layer 310 is large, thereby allowing the lights to be emitted to an outside.

The pixel defining layer 310 may include or be formed of an organic insulating material or an inorganic insulating material. In an embodiment, the pixel defining layer 310 may include an organic insulating material. In one embodiment, for example, the pixel defining layer 310 may include at least one selected from a photoresist, a polyacryl-based resin, a polyimide-based resin, a polyamide-based resin, a siloxane-based resin, an acryl-based resin, an epoxy-based resin, and the like. In an embodiment, the display device 100 does not include a polarizing layer, and the pixel defining layer 310 may have a substantially opaque color to reduce reflection of an external light. In one embodiment, for example, the pixel defining layer 310 may further include a light blocking material to absorb a light. The light blocking material may include at least one selected from carbon black, titanium nitride oxide, titanium black, phenylene black, aniline black, cyanine black, nigrosine acid black, a black resin, and the like.

The light emitting layer 330 may be disposed in the second sub-pixel area 32 on the second lower electrode 292. In an embodiment, the light emitting layer 330 may be disposed on the second lower electrode 292 exposed by the opening of the pixel defining layer 310. In an embodiment, the light emitting layer 330 may be formed by using at least one material selected from light emitting materials for emitting different color lights (i.e., a red light, a green light, a blue light, etc.) based on a type of a sub-pixel. Alternatively, the light emitting layer 330 may be formed by stacking a plurality of light emitting materials for generating different color lights such as a red light, a green light, and a blue light to emit a white light as a whole.

The upper electrode 340 may be disposed on the pixel defining layer 310, and the light emitting layer 330. In an embodiment, the upper electrode 340 may be disposed over the whole substrate 110. The upper electrode 340 may include at least one selected from a metal, a metal alloy, metal nitride, a conductive metal oxide, a transparent conductive material, and a combination thereof. In an embodiment, the upper electrode 340 may have a multilayer structure including a plurality of metal layers. In one embodiment, for example, the metal layers of the upper electrode 340 having a multilayer structure may have mutually different thicknesses, or may include mutually different materials.

In an embodiment, as described above, the sub-pixel structure 200 (e.g., a second sub-pixel structure) including the second lower electrode 292, the light emitting layer 330 (e.g., a light emitting layer configured to emit a green light), and the upper electrode 340 may be provided in the display device 100.

In such an embodiment, as described above with reference to the sub-pixel structure 200, the first lower electrode 291 and the light emitting layer 330 (e.g., a light emitting layer configured to emit a red light) may be disposed in the first sub-pixel area 31, and the third lower electrode 293 and the light emitting layer 330 (e.g., a light emitting layer configured to emit a blue light) may be disposed in the third sub-pixel area 33. In such an embodiment, the upper electrode 340 may be provided continuously in the first to third sub-pixel areas 31, 32, and 33.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the sub-pixel structure 200 from deteriorating due to penetration of moisture, oxygen, and the like. In addition, the first inorganic thin film encapsulation layer 451 may perform a function of protecting the sub-pixel structure 200 from an external impact. The first inorganic thin film encapsulation layer 451 may include an inorganic insulating material having flexibility.

The organic encapsulation layer 452 may be disposed on the first inorganic thin film encapsulation layer 451. The organic encapsulation layer 452 may improve flatness of the display device 100, and may protect the sub-pixel structure 200 together with the first inorganic thin film encapsulation layer 451. The organic encapsulation layer 452 may include an organic material having flexibility.

The second inorganic thin film encapsulation layer 453 may be disposed on the organic encapsulation layer 452. The second inorganic thin film encapsulation layer 453 may be disposed along a profile of the organic encapsulation layer 452 with a uniform thickness to cover the organic encapsulation layer 452. The second inorganic thin film encapsulation layer 453 may prevent the sub-pixel structure 200 from deteriorating due to the penetration of moisture, oxygen, and the like together with the first inorganic thin film encapsulation layer 451. In addition, the second inorganic thin film encapsulation layer 453 may perform a function of protecting the sub-pixel structure 200 from an external impact together with the first inorganic thin film encapsulation layer 451 and the organic encapsulation layer 452. The second inorganic thin film encapsulation layer 453 may include an inorganic insulating material having flexibility.

In an embodiment, as described above, the thin film encapsulation structure 450 including the first inorganic thin film encapsulation layer 451, the organic encapsulation layer 452, and the second inorganic thin film encapsulation layer 453 may be provided in the display device 100.

In an alternative embodiment, the thin film encapsulation structure 450 may have a five-layer structure in which three inorganic thin film encapsulation layers and two organic encapsulation layers are stacked one on another, or a seven-layer structure in which four inorganic thin film encapsulation layers and three organic encapsulation layers are stacked one on another.

The touch sensing structure 400 may be disposed on the thin film encapsulation structure 450. In an embodiment, the touch sensing structure 400 may be disposed between the thin film encapsulation structure 450 and the reflective member 490, and may make direct contact with a top surface of the thin film encapsulation structure 450. In one embodiment, for example, the touch sensing structure 400 may be substantially transparent, and the light emitted from the sub-pixel structure 200 may pass through the touch sensing structure 400. In an embodiment, the touch sensing structure 400 may include touch sensing electrodes. The touch sensing structure 400 may sense a part of a body of a user, an object, or the like located over the top surface of the display device 100 through the touch sensing electrodes. In an alternative embodiment, the touch sensing structure 400 may include a proximity sensor configured to detect proximity with respect to the user or the object located over the top surface of the display device 100.

Referring to FIGS. 3 and 5, the support member 480 may be disposed on the touch sensing structure 400. In such an embodiment, the touch sensing structure 400 may be disposed between the light blocking member 430 and the sub-pixel structure 200, and the support member 480 may not overlap the second sub-pixel area 32 (or the first sub-pixel area 31 and the third sub-pixel area 33). The light emitted from the sub-pixel structure 200 disposed in the second sub-pixel area 32 may be emitted to an outside through the second opening 482 of the support member 480. The second opening 482 of the support member 480 may be larger than the second opening 622 of the light blocking member 430. The support member 480 may serve to support the reflective member 490. In an embodiment, the side wall of the support member 480 that defines the second opening 482 of the support member 480 may be orthogonal to a top surface of the support member 480.

The support member 480 may include an organic insulating material or an inorganic insulating material. In an embodiment, the support member 480 may include at least one organic insulating material selected from a photoresist, acryl, polyacryl, polyimide, polyamide, epoxy, acrylate monomers, phenylacetylene, diamine, dianhydride, siloxane, polysiloxane, silane, parylene, olefin-based polymers (polyethylene or polypropylene), polyethylene terephthalate, and fluorine. In an embodiment, the support member 480 may include a resin including the at least one organic insulating material as a base material.

The reflective member 490 may be disposed on the side wall of the support member 480. In an embodiment, the reflective member 490 may be disposed between the light blocking member 430 and the sub-pixel structure 200 disposed in the second sub-pixel area 32. The reflective member 490 may not overlap the second opening 622 (or the first opening 621 and the third opening 623) in a direction from the substrate 110 to the light blocking member 430 or the thickness direction of the substrate 110. In such an embodiment, the light emitted from the sub-pixel structure 200 disposed in the second sub-pixel area 32 may include a first light L1, a second light L2, and a third light L3. In one embodiment, for example, the first light L1 may be a light emitted in a direction that is substantially perpendicular to the top surface of the second lower electrode 292. The first light L1 may pass through the second opening 482 of the support member 480 and the second opening 622 to be emitted to the outside. In such an embodiment, each of the second and third lights L2 and L3 may be a light emitted from the top surface of the second lower electrode 292 at a predetermined angle. Each of the second and third lights L2 and L3 may be reflected from the reflective member 490 to pass through the second opening 482 of the support member 480 and the second opening 622 to be emitted to the outside. In one embodiment, for example, a surface of the reflective member 490 from which the second and third lights L2 and L3 are reflected may be defined as a first side surface of the reflective member 490, and a surface of the reflective member 490 making contact with the support member 480 may be defined as a second side surface of the reflective member 490. In such an embodiment, the first side surface and the second side surface may face each other.

In an embodiment, as described above, the reflective member 490 may reflect the second light L2 and the third light L3 that may be incident onto the bottom surface of the light blocking member 430, so that a relatively large amount of light may be emitted to the outside. In such an embodiment, if the display device 100 does not include the reflective member 490 and the support member 480, the second light L2 and the third light L3 may be absorbed into the bottom surface of the light blocking member 430. In this case, a luminance of the display device may be decreased, and display quality of the display device may deteriorate.

The reflective member 490 may include at least one selected from a metal, a metal alloy, metal nitride, a conductive metal oxide, a transparent conductive material, and the like. In one embodiment, for example, the reflective member 490 may include at least one selected from gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride (CrN$_x$), tantalum nitride (TaN$_x$), strontium ruthenium oxide (SrRu$_x$O$_y$), zinc oxide (ZnO$_x$), indium tin oxide ("ITO"), tin oxide (SnO$_x$), indium oxide (InO$_x$), gallium oxide (GaO$_x$), indium zinc oxide ("IZO"), and a combination thereof. In an embodiment, the reflective member 490 may have a multi-layer structure including a plurality of metal layers.

The insulating layer 460 may be disposed on the touch sensing structure 400 and the support member 480. In an embodiment, the insulating layer 460 may cover the reflective member 490 and the support member 480 over the sub-pixel structure 200 disposed in the second sub-pixel area 32. In one embodiment, for example, the insulating layer 460 may sufficiently cover the support member 480 and the reflective member 490 on the touch sensing structure 400, and may have a substantially flat top surface without creating a step structure around the support member 480 and the reflective member 490. Alternatively, the insulating layer 460 may be disposed along a profile of the support member 480 and the reflective member 490 with a uniform thickness to cover the support member 480 and the reflective member 490 on the touch sensing structure 400. The insulating layer 460 may include an organic insulating material, an inorganic insulating material, or the like. In an embodiment, the insulating layer 460 may include an organic insulating material.

The light blocking member 430 may be disposed on the insulating layer 460. In an embodiment, the light blocking member 430 may be disposed over the sub-pixel structure 200 disposed in the second sub-pixel area 32, and the second opening 622 (or the first opening 621 and the third opening 623) may be defined in a portion of the light blocking member 430 that overlaps the sub-pixel structure 200. The light blocking member 430 may make direct contact with a top surface of the insulating layer 460. The light blocking member 430 may block (e.g., absorb) the external light incident to an inside of the display device 100 from the outside. In an embodiment, the display device 100 does not include a polarizing layer, the area of the second opening 622 may be relatively small, and a length of the light blocking member 430 in the first direction D1 or the second direction D2 may be relatively long to reduce the reflection of the external light. The light blocking member 430 may have a substantially opaque color. In one embodiment, for example, the light blocking member 430 may further include a light blocking material to absorb a light. The light blocking material may include at least one selected from carbon black, titanium nitride oxide, titanium black, phenylene black, aniline black, cyanine black, nigrosine acid black, a black resin, and the like.

The first to third color filters 511, 512, and 513 may be disposed on the insulating layer 460 and the light blocking member 430. The first color filter 511 may have a red color, the second color filter 512 may have a green color, and the third color filter 513 may have a blue color. In one embodiment, for example, the second color filter 512 may be disposed on a part of the light blocking member 430 adjacent to the second sub-pixel area 32 while filling the second opening 622 of the light blocking member 430. In such an embodiment, the first color filter 511 may be disposed on a part of the light blocking member 430 adjacent to the first sub-pixel area 31 while filling the first opening 621 of the light blocking member 430. In such an embodiment, the third color filter 513 may be disposed on a part of the light blocking member 430 adjacent to the third sub-pixel area 33 while filling the third opening 623 of the light blocking member 430. Each of the first to third color filters 511, 512, and 513 may include a photosensitive resin and a color photoresist. In an embodiment, the color filters 510 including the first to third color filters 511, 512, and 513 may be provided in the display device 100 as described above.

In an embodiment, as described above, the display device 100 including the substrate 110, the semiconductor element 250, the gate insulating layer 150, the interlayer insulating layer 190, the planarization layer 270, the sub-pixel structure 200, the pixel defining layer 310, the thin film encapsulation structure 450, the touch sensing structure 400, the support member 480, the reflective member 490, the insulating layer 460, the light blocking member 430, the color filters 510, and the like may be provided.

In a conventional display device from which the polarizing layer is removed, the conventional display device may include a light blocking member and a color filter to reduce the reflection of the external light instead of the polarizing layer, and may reduce the reflection of the external light by increasing the area of the light blocking member. However, in such a conventional display device where the area of the light blocking member is increased, the reflection of the external light may be relatively reduced, while an aperture ratio, a luminance, and the like of the light emitting layer included in the display device may be decreased, so that display quality of the conventional display device may deteriorate.

According to embodiments of the invention, the display device 100 may include a light blocking member 430 having a relatively large area to reduce the reflection of the external light. In such embodiments, the display device 100 includes the reflective member 490 and the support member 480 as described above, such that a relatively large amount of the light emitted from the sub-pixel structure 200 may be emitted to an outside of the display device 100. Accordingly, even when the display device 100 includes the light blocking member 430 having a relatively large area, the luminance of the display device 100 may be relatively increased, and the display quality of the display device 100 that does not include a polarizing layer may be relatively improved.

In such embodiments, the display device 100 includes the pixel defining layer 310 having a relatively large tapering angle as described above, such that an aperture ratio of the display device 100 may be relatively increased.

Figure 6:
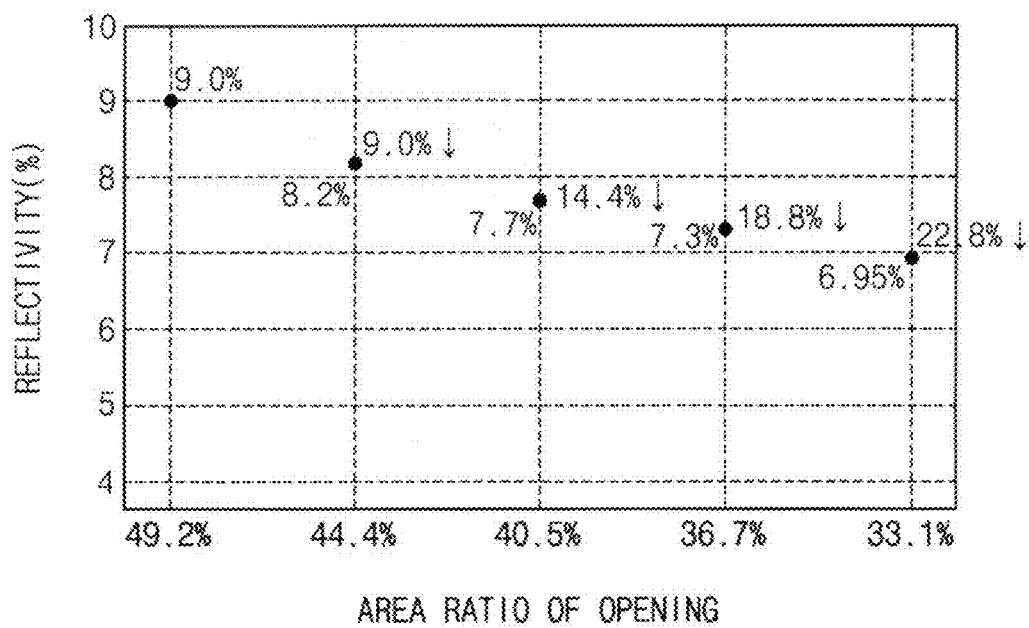
FIG. 6 is a graph showing a reflectivity of an embodiment of the display device of FIG. 4 and a reflectivity of a comparative example.

FIG. 6 is a graph showing a reflectivity of an embodiment of the display device of FIG. 4 and a reflectivity of a comparative example.

Hereinafter, an experimental example for evaluation of reflectivity according to area ratio of opening of light blocking member will be described.

A display device according to Comparative Example (e.g., that does not include the reflective member 490 and the support member 480) was formed to have a structure in which an area of an opening of a light blocking member based on a total area of the light blocking member is approximately 49.2%.

In the experimental example, display devices, each of which includes the reflective member 490 and the support member 480, according to an embodiment of the invention were formed to have structures in which the area of the opening of the light blocking member based on the total area of the light blocking member is approximately 44.4%, 40.5%, 36.7%, and 33.1%, respectively. In the display device according to the embodiment, as the area of the opening decreases, the light blocking member may have a relatively large area.

A reflectivity was measured by radiating a light from a top of the display device according to Comparative Example and the display devices according to the embodiment. As a result of the measurement, as shown in FIG. 6, a reflectivity of the display device according to Comparative Example (e.g., the structure in which the area of the opening of the light blocking member based on the total area of the light blocking member is approximately 49.2%) was measured to be approximately 9%, and reflectivities of the display devices according to the embodiment (e.g., the structures in which the area of the opening of the light blocking member based on the total area of the light blocking member is approximately 44.4%, approximately 40.5%, approximately 36.7%, and approximately 33.1%, respectively) were measured to be approximately 8.2%, approximately 7.7%, approximately 7.3% and approximately 6.95%, respectively. As shown in FIG. 6, as the area of the opening decreases, the reflectivity of the display device was gradually decreased.

Figure 7:
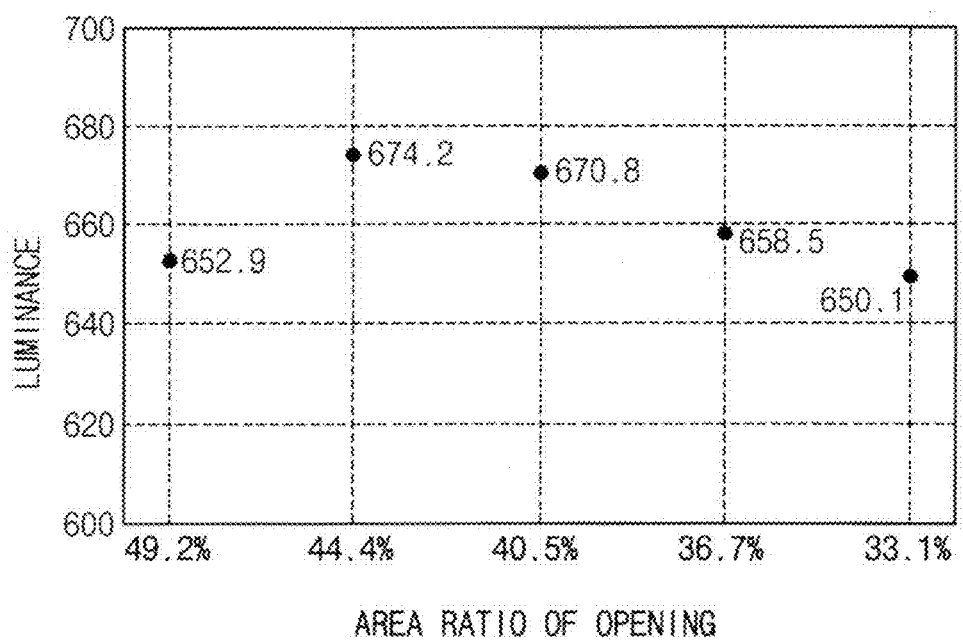
FIG. 7 is a graph showing a luminance of an embodiment of the display device of FIG. 4 and a luminance of the comparative example.

FIG. 7 is a graph showing a luminance of an embodiment of the display device of FIG. 4 and a luminance of the comparative example.

Hereinafter, an experimental example for evaluation of luminance according to area ratio of opening of light blocking member will be described.

The display device according to Comparative Example (e.g., that does not include the reflective member 490 and the support member 480) was formed to have the structure in which the area of the opening of the light blocking member based on the total area of the light blocking member is approximately 49.2%.

In the experimental example, the display devices, each of which includes the reflective member 490 and the support member 480, according to an embodiment of the invention were formed to have the structures in which the area of the opening of the light blocking member based on the total area of the light blocking member is approximately 44.4%, 40.5%, 36.7%, and 33.1%, respectively. In the display device according to the embodiment, as the area of the opening decreases, the light blocking member may have a relatively large area.

A luminance of a light emitted to an outside was measured by driving the display device according to Comparative Example and the display devices according to the embodiment. As a result of the measurement, as shown in FIG. 7, a luminance of the display device according to Comparative Example (e.g., the structure in which the area of the opening of the light blocking member based on the total area of the light blocking member is approximately 49.2%) was measured to be approximately 652.9, and luminances of the display devices according to the embodiment (e.g., the structures in which the area of the opening of the light blocking member based on the total area of the light blocking member is approximately 44.4%, approximately 40.5%, approximately 36.7%, and approximately 33.1%, respectively) were measured to be approximately 674.2, approximately 670.8, approximately 658.5 and approximately 650.1, respectively. Accordingly, it is shown that even when the display devices according to the embodiment include the light blocking member having a relatively large area to reduce the reflection of the external light, a relatively large amount of the light emitted from the sub-pixel structure 200 may be emitted to the outside of the display device 100 since the display device includes the reflective member 490 and the support member 480. In an embodiment of the invention, the luminance of the display device may be relatively increased even when the display device includes the light blocking member having a relatively large area, and the display quality of the display device that does not include a polarizing layer may be relatively improved.

Figure 8:
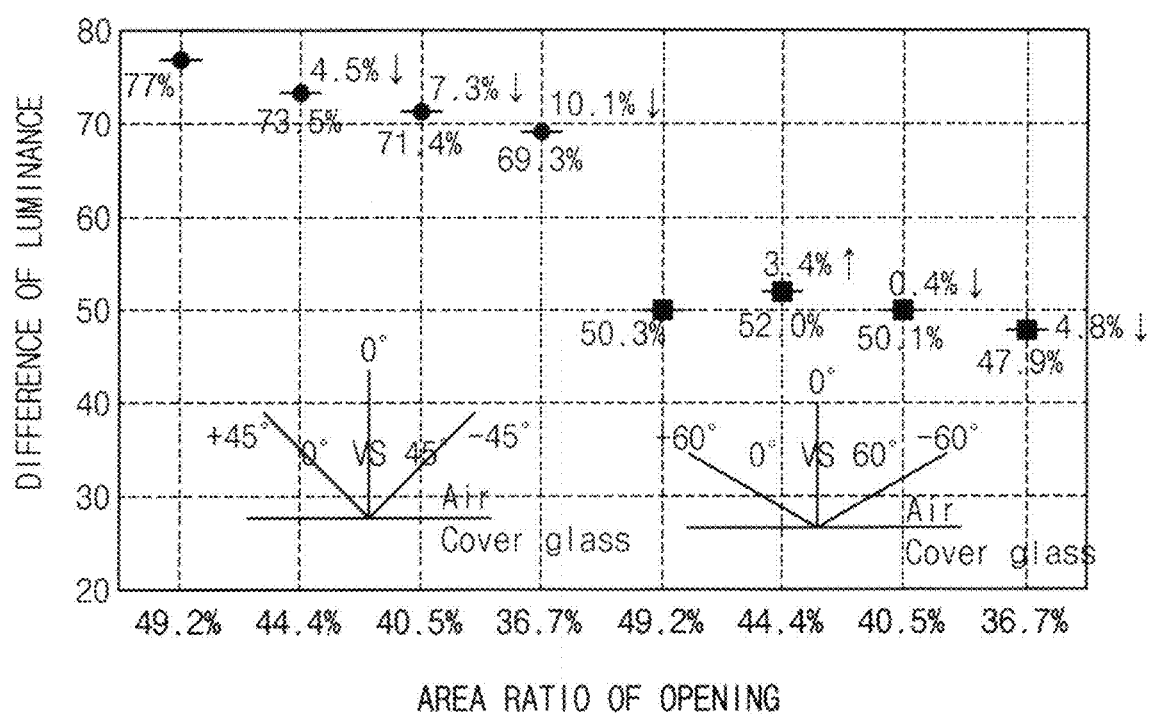
FIG. 8 is a graph showing a difference of luminance of an embodiment of the display device of FIG. 4 and a difference of luminance of the comparative example.

FIG. 8 is a graph showing a difference of luminance of an embodiment of the display device of FIG. 4 and a difference of luminance of the comparative example.

Hereinafter, an experimental example for evaluation of difference of luminance according to area ratio of opening of light blocking member will be described.

The display device according to Comparative Example (e.g., that does not include the reflective member 490 and the support member 480) was formed to have the structure in which the area of the opening of the light blocking member based on the total area of the light blocking member is approximately 49.2%.

In the experimental example, the display devices, each of which includes the reflective member 490 and the support member 480, according to an embodiment of the invention were formed to have the structures in which the area of the opening of the light blocking member based on the total area of the light blocking member is approximately 49.2%, 44.4%, 40.5%, and 36.7%, respectively. In the display device according to the embodiment, as the area of the opening decreases, the light blocking member may have a relatively large area.

A difference of luminance (e.g., white angular dependency ("WAD")) of the light emitted to the outside was measured by driving the display device according to Comparative Example and the display devices according to the embodiment. Here, the WAD refers to tilt of color at a side viewing angle. As a result of the measurement, as shown in FIG. 8, when the display device according to Comparative Example (hereinafter, Comparative Example) is compared with the display devices according to the embodiment (hereinafter, Examples), it is shown that a WAD of Comparative Example and WADs of Examples (especially when the area of the opening of the light blocking member based on the total area of the light blocking member is approximately 44.4% and approximately 40.5%) are at similar levels. Accordingly, in an embodiment of the display device including the reflective member 490 and the support member 480, the WAD may be maintained at a normal level.

Embodiments of the invention may be applied to various electronic devices including a display device, such as vehicle-display devices, ship-display devices, aircraft-display devices, portable communication devices, display devices for a display or for an information transfer and medical-display devices, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
 a substrate on which a display area including a sub-pixel area is defined;
 a sub-pixel structure disposed in the sub-pixel area on the substrate;
 a light blocking member disposed over the sub-pixel structure, wherein a first opening is defined in a portion of the light blocking member which overlaps the sub-pixel structure; and a reflective member disposed between the light blocking member and the sub-pixel structure, wherein the reflective member surrounds the sub-pixel structure and the first opening, and a sidewall defining a major surface plane of the reflective member is orthogonal to a top surface defining the substrate.

2. The display device of claim 1, wherein the reflective member does not overlap the first opening in a thickness direction of the substrate.

3. The display device of claim 1, further comprising:
a support member disposed between the light blocking member and the sub-pixel structure, wherein a second opening is defined in the support member to overlap the first opening.

4. The display device of claim 3, wherein a side wall of the support member, which defines the second opening, makes contact with the reflective member.

5. The display device of claim 4, wherein the side wall of the support member is orthogonal to a top surface of the support member.

6. The display device of claim 3, wherein the second opening is larger than the first opening.

7. The display device of claim 3, further comprising:
an insulating layer which covers the reflective member and the support member over the sub-pixel structure.

8. The display device of claim 7, wherein the light blocking member makes contact with a top surface of the insulating layer.

9. The display device of claim 3, wherein the sub-pixel structure includes:
a lower electrode;
a light emitting layer disposed on the lower electrode, wherein the light emitting layer emits a light; and
an upper electrode disposed on the light emitting layer, wherein a part of the light emitted from the light emitting layer is reflected from the reflective member.

10. The display device of claim 9, further comprising:
a pixel defining layer disposed on the lower electrode, wherein an opening is defined in the pixel defining layer to expose a part of a top surface of the lower electrode.

11. The display device of claim 10, wherein a virtual line extending along a side wall of the pixel defining layer, which defines the opening of the pixel defining layer, passes through the support member.

12. The display device of claim 10, wherein each of the light blocking member and the pixel defining layer has an opaque color.

13. The display device of claim 1, further comprising:
a thin film encapsulation structure disposed between the sub-pixel structure and the reflective member.

14. The display device of claim 13, wherein the thin film encapsulation structure includes:
a first inorganic thin film encapsulation layer;
an organic encapsulation layer disposed on the first inorganic thin film encapsulation layer; and
a second inorganic thin film encapsulation layer disposed on the organic encapsulation layer.

15. The display device of claim 13, further comprising:
a touch sensing structure disposed between the thin film encapsulation structure and the reflective member.

16. The display device of claim 15, wherein the touch sensing structure makes contact with a top surface of the thin film encapsulation structure.

17. The display device of claim 1, further comprising:
a color filter disposed on the light blocking member, wherein the color filter fills the first opening.

* * * * *